US009990898B2

(12) United States Patent
Lee

(10) Patent No.: US 9,990,898 B2
(45) Date of Patent: Jun. 5, 2018

(54) VOLTAGE SUPPLY UNIT AND DISPLAY DEVICE HAVING THE SAME

(71) Applicant: LG Display Co., Ltd., Seoul (KR)

(72) Inventor: Do Gon Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 14/865,230

(22) Filed: Sep. 25, 2015

(65) Prior Publication Data

US 2016/0155406 A1 Jun. 2, 2016

(30) Foreign Application Priority Data

Dec. 2, 2014 (KR) ........................ 10-2014-0170149

(51) Int. Cl.
*H03K 7/02* (2006.01)
*G09G 3/36* (2006.01)

(52) U.S. Cl.
CPC ......... *G09G 3/3696* (2013.01); *G09G 3/3659* (2013.01); *G09G 3/3677* (2013.01); *G09G 2310/08* (2013.01); *G09G 2320/0257* (2013.01); *G09G 2330/025* (2013.01); *G09G 2330/027* (2013.01)

(58) Field of Classification Search
CPC ..... H02M 3/07; G09G 3/3648; G09G 3/3677; G09G 3/3266; G09G 3/006
USPC .................. 323/282; 332/116; 345/211–212; 348/184
See application file for complete search history.

(56) References Cited

U.S. PATENT DOCUMENTS

| | | | | |
|---|---|---|---|---|
| 9,502,967 | B2 * | 11/2016 | Lu | H02M 3/07 |
| 2005/0052170 | A1 * | 3/2005 | Kim | H02M 3/07 323/282 |
| 2008/0309597 | A1 | 12/2008 | Nam et al. | |
| 2010/0182305 | A1 | 7/2010 | Fang et al. | |
| 2011/0193844 | A1 * | 8/2011 | Lee | G09G 3/3648 345/211 |
| 2011/0316640 | A1 * | 12/2011 | Chang | G09G 3/3677 332/116 |
| 2012/0268096 | A1 | 10/2012 | Kawasoe et al. | |
| 2013/0321644 | A1 * | 12/2013 | Chung | G09G 3/006 348/184 |
| 2014/0340380 | A1 * | 11/2014 | Song | G09G 3/3266 345/212 |

* cited by examiner

*Primary Examiner* — Abdul-Samad A Adediran
(74) *Attorney, Agent, or Firm* — Morgan, Lewis & Bockius LLP

(57) ABSTRACT

A voltage supply unit and a display device including the voltage supply unit are provided. The voltage supply unit includes a first voltage input terminal to which a first voltage as a DC voltage is input; a second voltage input terminal to which a second voltage as an AC voltage is input; a first capacitor between a first node and the second voltage input terminal; and a current control circuit between the first voltage input terminal and the first node and controlling a current value flowing from the first voltage input terminal to the first node so as to be equal to or less than a current limit value.

6 Claims, 9 Drawing Sheets

VOLTAGE SUPPLY UNIT AND DISPLAY DEVICE HAVING THE SAME

The present invention claims the benefit of Korean Patent Application No. 10-2014-0170149, filed Dec. 2, 2014, which is hereby incorporated by reference.

BACKGROUND

Field of the Invention

The present invention relates to a voltage supply unit and a display device having the voltage supply unit.

Discussion of the Related Art

Recently, various display devices have been developed which can decrease in weight and volume which are demerits of cathode ray tubes. Examples of the display devices include a liquid crystal display device, a field emission display device, and an organic light-emitting display device.

A display device includes a display panel that has data lines, gate lines, and pixels coupled to the data lines and the gate lines, a gate driver supplying gate signals to the gate lines, a data driver supplying data voltages to the data lines, and a voltage supply unit supplying drive voltages to the gate driver and the data driver. Each pixel receives a data voltage from a data line when a gate signal of a gate-high voltage is supplied to each pixel from a gate line, and emits light with predetermined brightness depending on the data voltage.

When the display device is powered off, a voltage input to the voltage supply unit is cut off and thus the voltage supply unit does not supply the drive voltages to the gate driver and the data driver any more. When the display device is powered off and the data voltages supplied to the pixels are not discharged, the data voltages may remain in the pixels. In this case, even when the display device is powered off, the display panel displays an afterimage or an abnormal image during a predetermined period of time due to the data voltages remaining in the pixels. In order to prevent this phenomenon, the display device controls the gate driver in a discharge mode using a discharge signal when the display device is powered off. The gate driver is controlled to supply the gate signals of a gate-high voltage to all the gate lines during a predetermined period of time in the discharge mode. In this case, since the data voltages remaining in the pixels are discharged to the data lines, the display panel does not display an afterimage or an abnormal image.

On the other hand, when the display device is driven in a sleep mode or firmware is refreshed after being updated, or due to unknown errors, there may occur a problem in that a discharge signal controls the gate driver in the discharge mode even when the voltage supply unit normally supplies the drive voltages to the gate driver and the data driver. In this case, even when the display device is not powered off, the gate driver performs an abnormal driving operation of supplying the gate signals of a gate-high voltage to all the gate lines. When the gate driver performs the abnormal driving operation, the gate driver requires a current much higher than that when the gate driver performs a normal driving operation, and thus the voltage supply unit supplies the gate driver with a current which is much larger than that when the gate driver performs the normal driving operation. At this time, when the abnormal driving operation of the gate driver is continuously performed for a predetermined period of time, there may occur a problem in that the current supplied from the voltage supply unit to the gate driver is not recovered to the original state even when the discharge signal does not control the gate driver in the discharge mode any more. In this case, the display device continuously displays an abnormal image.

Since the voltage supply unit supplies the gate driver with a current which is much higher than that when the gate driver performs a normal driving operation, there may occur a problem in that a component is damaged, for example, a resistor of the voltage supply unit is burnt.

SUMMARY

Accordingly, the present invention is directed to a voltage supply unit and display device having the same that substantially obviate one or more of the problems due to limitations and disadvantages of the related art.

An object of the present invention is to provide a voltage supply unit that can prevent an abnormal image from being displayed on a display device by controlling a current of the voltage supply unit when the voltage supply unit normally supplies drive voltages to a gate driver and a data driver but a discharge signal controls the gate driver in a discharge mode and a display device including the voltage supply unit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a voltage supply unit comprises a first voltage input terminal to which a first voltage as a DC voltage is input; a second voltage input terminal to which a second voltage as an AC voltage is input; a first capacitor between a first node and the second voltage input terminal; and a current control circuit between the first voltage input terminal and the first node and controlling a current value flowing from the first voltage input terminal to the first node so as to be equal to or less than a current limit value.

The current control circuit may include: a regulator of which an input terminal is coupled to the first voltage input terminal and of which an output terminal and an ADJ terminal are coupled to the first node; and a first resistor between the output terminal of the regulator and the first node.

When the current limit value is defined as CLV, a resistance value of the first resistor is defined as RV1, and an output voltage of the ADJ terminal of the regulator is defined as Vadj, the current limit value may be defined by:

$$CLV = \frac{Vadj}{RV1}.$$

The voltage supply unit may further include: a first diode between the first node and the current control circuit; and a second diode between the first node and an output terminal.

In another aspect, a display device comprises a display panel that includes data lines, gate lines, and pixels coupled to the data lines and the gate lines; a gate driver supplying gate signals to the gate lines; a data driver supplying data voltages to the data lines; a discharge control circuit that supplies a discharge signal for controlling the gate driver in a normal mode or a discharge node; and a gate-high voltage supply unit supplying gate-high voltages to the gate driver, wherein the gate-high voltage supply unit includes a first voltage input terminal to which a first voltage as a DC voltage is input, a second voltage input terminal to which a second voltage as an AC voltage is input, a first capacitor between a first node and the second voltage input terminal, and a current control circuit between the first voltage input terminal and the first node and controlling a current value flowing from the first voltage input terminal to the first node so as to be equal to or less than a current limit value.

The current control circuit may include: a regulator of which an input terminal is coupled to the first voltage input terminal and of which an output terminal and an ADJ terminal are coupled to the first node; and a first resistor between the output terminal of the regulator and the first node.

When the current limit value is defined as CLV, a resistance value of the first resistor is defined as RV1, and an output voltage of the ADJ terminal of the regulator is defined as Vadj, the current limit value may be defined by:

$$CLV = \frac{Vadj}{RV1}.$$

The gate-high voltage supply unit may further include: a first diode between the first node and the current control circuit; and a second diode between the first node and an output terminal.

The display device may further include: a discharge control circuit supplying a discharge signal of a first logic-level voltage to the gate driver in a normal mode and supplying a discharge signal of a second logic-level voltage to the gate driver in a discharge mode; and a timing control unit supplying a gate control signal for controlling an operation timing of the gate driving timing to the gate driver.

The gate driver may generate gate signals having pulses of the gate-high voltage and output the generated gate signals to the gate lines in response to the gate control signal when the discharge signal of the first logic-level voltage is input, and may output the gate signals of the gate-high voltage to the gate lines when the discharge signal of the second logic-level voltage is input.

A current value of the first node may increase by a predetermined width when the discharge signal is switched from the first logic-level voltage to the second logic-level voltage, and then the current value of the first node may decrease by the predetermined width when the discharge signal is switched from the second logic-level voltage to the first logic-level voltage.

In another aspect, a display device comprises a display panel that includes data lines, gate lines, and pixels coupled to the data lines and the gate lines; a gate driver supplying gate signals to the gate lines; and a gate-high voltage supply unit supplying gate-high voltages to the gate driver, wherein the gate driver performs an abnormal driving operation of supplying a gate-high voltage to the gate lines in a state in which the display device is not powered off, a current value of a voltage input to the gate-high voltage supply unit is controlled to be equal to or less than a current limit value so as to prevent a current supplied from the gate-high voltage supply unit to the gate driver from increasing.

The display device may further include: a discharge control circuit supplying a discharge signal of a first logic-level voltage to the gate driver in a normal mode and supplying a discharge signal of a second logic-level voltage to the gate driver in a discharge mode.

The current value may increase by a predetermined width when the discharge signal is switched from the first logic-level voltage to the second logic-level voltage, and then the current value may decrease by the predetermined width when the discharge signal is switched from the second logic-level voltage to the first logic-level voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
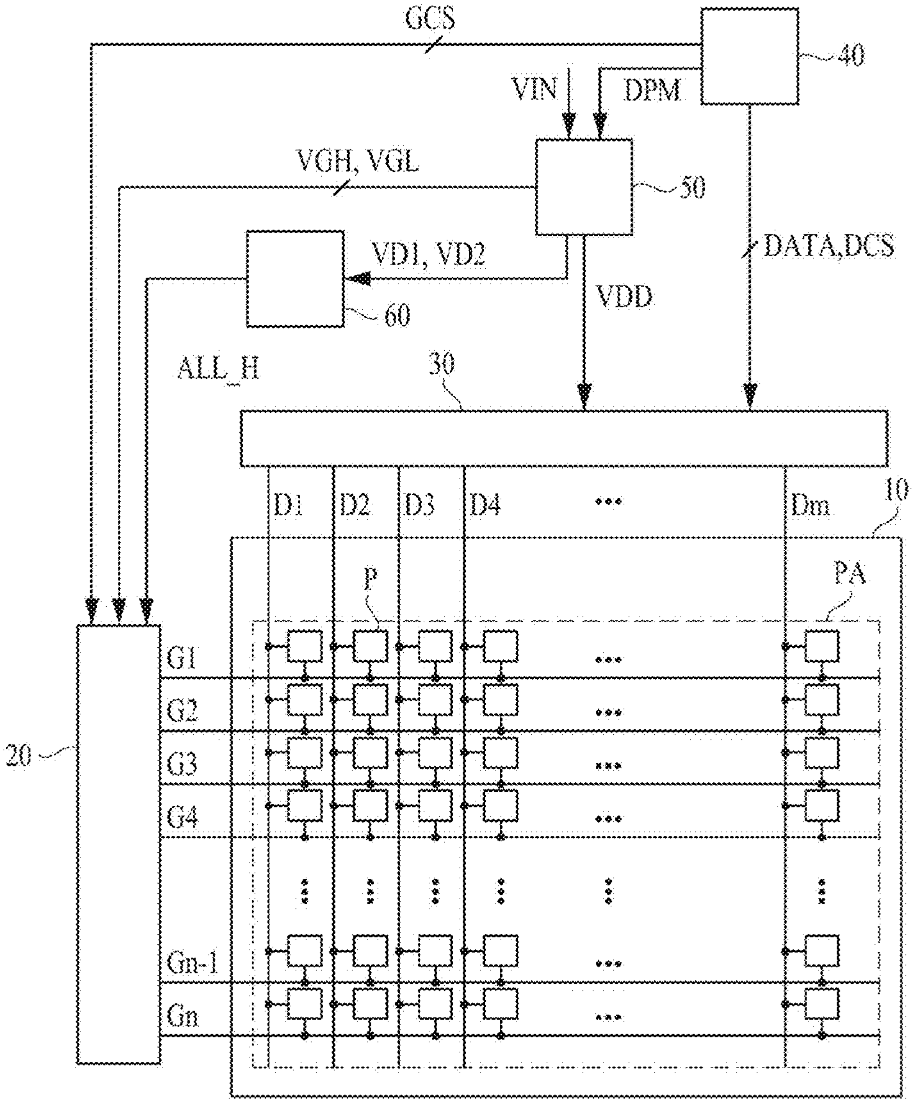
FIG. 1 is a block diagram schematically illustrating a display device according to an embodiment of the present invention.

Hereinafter, exemplary embodiments of the present invention will be described in detail with reference to the accompanying drawings. Like reference numerals references like elements. In the following description, when it is determined that specific description of known functions or configurations relevant to the present invention can unnecessarily make the gist of the present invention vague, the detailed description will not be made. Elements names used in the following description may be selected in consideration of easy drafting of this specification and may be different from actual element names of a product.

FIG. 1 is a block diagram schematically illustrating a display device according to an embodiment of the present invention. Referring to FIG. 1, a display device according to an embodiment of the present invention includes a display panel 10, a gate driver 20, a data driver 30, a timing control unit 40, a voltage supply unit 50, and a discharge control circuit 60.

The display device according to this embodiment is not particularly limited, as long as the display device can supply data voltages to pixels P via data lines D1 to Dm through a line progressive scanning of sequentially supplying gate signals to gate lines G1 to Gn. For example, the display device according to this embodiment may be embodied as any one of a liquid crystal display device, an organic light-emitting display device, a field emission display device, and an electrophoresis display device. The present invention will be described below in the following embodiments on the premise that the display device is embodied as a liquid crystal display device, but is not limited to the liquid crystal display device.

The display panel 10 includes an upper substrate, a lower substrate, and a liquid crystal layer interposed therebetween. The lower substrate of the display panel 10 is provided with a pixel array PA including pixels P which are arranged in a matrix shape in an area formed by intersection structures of the data lines D1 to Dm (where m is a positive integer of 2 or greater) and the gate lines G1 to Gn (where n is a positive integer of 2 or greater).

Figure 2:
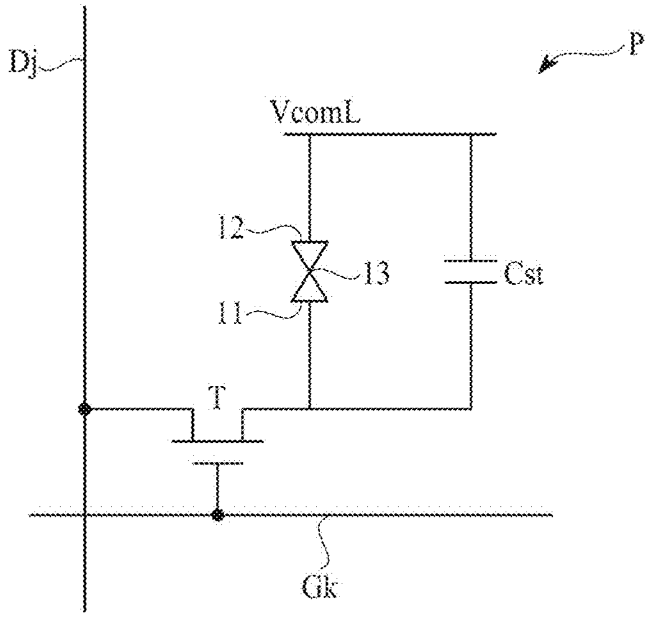
FIG. 2 is a circuit diagram illustrating a pixel in FIG. 1 in detail.

As illustrated in FIG. 2, each pixel P includes a transistor T, a pixel electrode 11, a common electrode 12, a liquid crystal cell 13, and a storage capacitor Cst. The transistor T is turned on in response to the gate signal of the k-th (where k is a positive integer satisfying $1 \le k \le n$) gate line Gk and supplies the data voltage of the j-th (where j is a positive integer satisfying $1 \le j \le m$) data line Dj to the pixel electrode 11. The common electrode 12 is supplied with a common voltage from a common voltage line VcomL. Accordingly, each pixel P can adjust a transmission amount of incident light from backlight unit by driving the liquid crystal of a liquid crystal cell 13 with an electric field which is generated due to a potential difference between the data voltage supplied to the pixel electrode 11 and the common voltage supplied to the common electrode 12. As a result, the pixels P can display an image. The storage capacitor Cst is disposed between the pixel electrode 11 and the common electrode 12 and keeps the voltage difference between the pixel electrode 11 and the common electrode 12 constant.

A black matrix and color filters can be formed on the upper substrate of the display panel 10. When the liquid crystal display device is formed in a color filters on TFT array (COT) system, the black matrix and the color filters may be formed on the lower substrate.

The common electrode 12 is formed on the upper substrate in a vertical electric field driving mode such as a twisted nematic (TN) mode and a vertical alignment (VA) mode, and may be formed on the lower substrate along with the pixel electrodes in a horizontal electric field driving mode such as an in-plane (IPS) mode or a fringe field switching (FFS) mode. The liquid crystal display device according to the present invention may be embodied in any liquid crystal mode as well as the TN mode, the VA, mode, the IPS mode, and the FFS mode. An alignment film for setting a pre-tilt angle of the liquid crystal and a polarizing film are formed on each of the upper substrate and the lower substrate of the display panel 10.

A backlight unit for uniformly irradiating the display panel 10 with light can be disposed below the display panel 10. The backlight unit may be embodied in a direct type in which light sources are disposed at the center or front of the backlight unit or in an edge type in which the light sources are disposed at the edge or side of the display panel 10.

The gate driver 20 is coupled to the gate lines G1 to Gn and outputs gate signals to the gate lines G1 to Gn. The gate signals can swing between a gate-high voltage VGH and a gate-low voltage VGL. The gate-high voltage VGH is a voltage that can turn on the transistors of the pixels P, and the gate-low voltage VGL is a voltage that can turn off the transistors of the pixels P. For example, the gate-high voltage VGH may be a voltage equal to or higher than 25 V and the gate-low voltage VGL may be a voltage equal to or lower than −5 V.

Figure 3A:
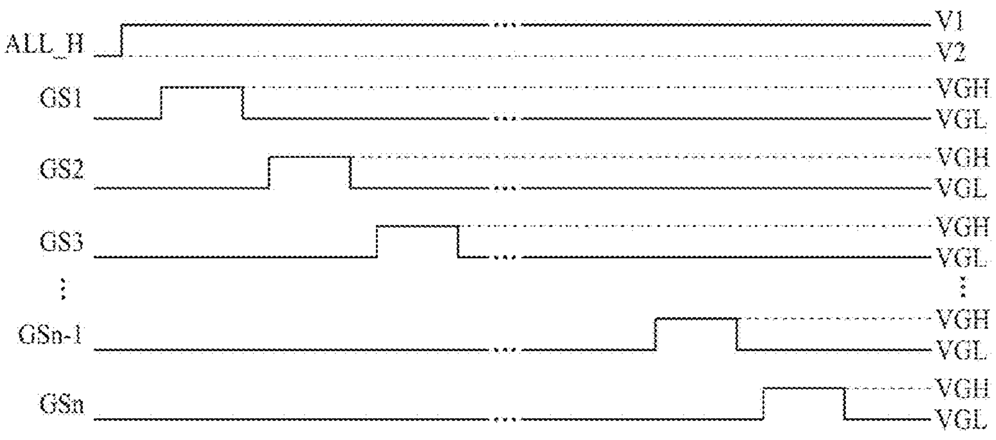
FIGS. 3A and 3B are waveform diagrams illustrating a discharge signal and gate signals.
Figure 3B:
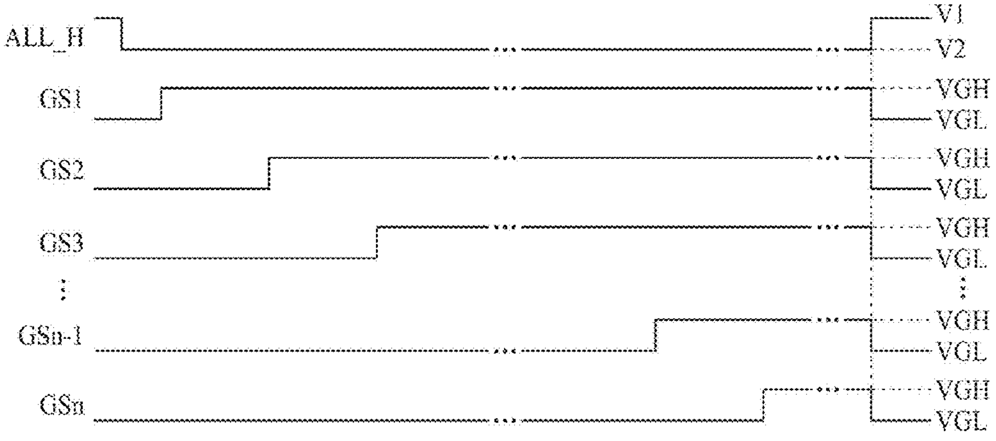

The gate driver 20 receives a gate control signal GCS from the timing control unit 40. The gate driver 20 receives the gate-high voltage VGH and the gate-low voltage VGL from the voltage supply unit 50 and a discharge signal ALL_H from the discharge control circuit 60. As illustrated in FIGS. 3A and 3B, the discharge signal ALL_H can swing between a first logic-level voltage V1 and a second logic-level voltage V2. For example, the first logic-level voltage V1 may be a voltage of about 3.3 V and the second logic-level voltage V2 may be a voltage of about 0 V.

The gate driver 20 is driven in a normal mode when the discharge signal ALL_H of the first logic-level voltage is input. In the normal mode, the gate driver 20 generates the gate signals having pulses of the gate-high voltage VGH in response to the gate control signal GCS and outputs the generated gate signals to the gate lines G1 to Gn in a predetermined order. The predetermined order may be a sequential order.

The gate driver 20 is driven in a discharge mode when the discharge signal ALL_H of the second logic-level voltage is input. In the discharge mode, the gate driver 20 generates the gate signals the gate-high voltage VGH and outputs the generated gate signals to the gate lines G1 to Gn.

When the gate driver 20 outputs the gate signals of the gate-high voltage VGH to the gate lines G1 to Gn in a period in which the discharge signal ALL_H of the second logic-level voltage is input, the transistors T of the pixels P maintain the turned-on state. At this time, when the display device is powered off, the data driver 30 does not supply the data voltages to the data lines D1 to Dm and thus the voltages of the pixel electrodes 11 are discharged to the data lines. As a result, since the data voltages do not remain in the pixels P, the display device does not display an afterimage or an abnormal image when the display device is powered off.

Detailed description of the gate signals output from the gate driver 20 in the normal mode and the discharge mode will be made later with reference to FIGS. 3A and 3B.

The data driver 30 is coupled to the data lines D1 to Dm and outputs the data voltages to the data lines D1 to Dm. The data driver 30 is supplied with digital video data DATA and a data control signal DCS from the timing control unit 30 and converts the digital video data DATA into data voltages in response to the data control signal DCS. The data driver 30 supplies the data voltages to the data lines D1 to Dm.

When the display device is powered on, the timing control unit 40 is turned on with an input of predetermined drive voltages from the outside and supplies a power management signal DPM to the voltage supply unit 50. The power management signal DPM is a signal for controlling the ON and OFF states of the voltage supply unit 50 and can swing between a third logic-level voltage and a fourth logic-level voltage. The third logic-level voltage may be substantially the same voltage as the first logic-level voltage and the fourth logic-level voltage may be substantially the same voltage as the second logic-level voltage, but the present invention is not limited to thereto.

The timing control unit 40 is supplied with digital video data DATA and a timing signal from an external system. The timing signal may include a vertical sync signal, a horizontal sync signal, a data enable signal, and a dot clock. The timing control unit 40 generates the gate control signal GCS for controlling the operation timing of the gate driver 20 and the data control signal DCS for controlling the operation timing of the data driver 30, based on the timing signal.

The voltage supply unit 50 is supplied with the power management signal DPM from the timing control unit 40 and is supplied with a drive voltage VIN of 12 V from an external power supply unit.

When the power management signal DPM of the third logic-level voltage is input, the voltage supply unit 50 is turned on to generate a drive voltage VDD, a gate-high voltage VGH, a gate-low voltage VGL, and discharge control circuit drive voltages VD1 and VD2. In this case, the voltage supply unit 50 supplies the drive voltage VDD to the data driver 30, supplies the gate-high voltage VGH and the gate-low voltage VGL to the gate driver 20, and supplies the discharge control circuit drive voltages VD1 and VD2 to the discharge control circuit 60. The voltage supply unit 50 is turned off when the power management signal DPM of the fourth logic-level voltage is input. Detailed description of the voltage supply unit 50 will be made later with reference to FIG. 4.

The discharge control circuit 60 is supplied with the discharge control circuit drive voltages VD1 and VD2 from the voltage supply unit 50. The discharge control circuit drive voltages VD1 and VD2 may be a drive voltage for driving the discharge control circuit 60 and an enable voltage for enabling the discharge control circuit 60. When the discharge control circuit drive voltages VD1 and VD2 are input, the discharge control circuit 60 outputs the discharge signal ALL_H to the gate driver 20. The discharge control circuit 60 can be embodied as an integrated circuit (hereinafter, referred to as an "IC").

When the display device is powered on, the discharge control circuit 60 outputs the discharge signal ALL_H of the first logic-level voltage to the gate driver 20. When the display device is powered off, the discharge control circuit 60 outputs the discharge signal ALL_H of the second logic-level voltage to the gate driver 20 for several millisecond, dozens of millisecond or several seconds.

On the other hand, in general, the discharge signal ALL_H is output as the first logic-level voltage when the display device is powered on and is output as the second logic-level voltage when the display device is powered off. However, when the display device is driven in a sleep mode or firmware is refreshed after being updated, or due to unknown errors, even if the display device is not powered off, the discharge signal ALL_H may be output as the second logic-level voltage.

FIGS. 3A and 3B are waveform diagrams illustrating the discharge signal and the gate signals in the normal mode and the discharge mode. FIG. 3A illustrates the discharge signal ALL_H and the gate signals GS1 to GSn in the normal mode and FIG. 3B illustrates the discharge signal ALL_H and the gate signals GS1 to GSn in the discharge mode. In FIGS. 3A and 3B, only the first to third gate signals GS1 to GS3 and the (n−1)-th and n-th gate signals GSn−1 and GSn are illustrated for the purpose of convenience of explanation.

Referring to FIG. 3A, when the discharge signal ALL_H of the first logic-level voltage V1 is input, the gate driver 20 outputs the gate signals GS1 to GSn having pulses of the gate-high voltage VGH to the gate lines G1 to Gn in a predetermined order in response to the gate control signal GCS. The predetermined order may the sequential order as illustrated in FIG. 3A.

Each pulse width of the gate signals GS1 to GSn may be substantially one horizontal period. One horizontal period refers to a period in which data voltages are supplied to the pixels P in one horizontal line, and the pixels P in one horizontal line refers to pixels coupled to the same gate line.

Referring to FIG. 3B, when the discharge signal ALL_H of the second logic-level voltage V2 is input, the gate driver 20 outputs the gate signals GS1 to GSn of the gate-high voltage VGH to the gate lines G1 to Gn in a predetermined order regardless of the gate control signal GCS. The predetermined order may the sequential order as illustrated in FIG. 3B.

The gate driver 20 can maintain the gate signals GS1 to GSn at the gate-high voltage VGH in the period in which the discharge signal ALL_H of the second logic-level voltage V2 is input. Accordingly, since the transistors T of the pixels P of the display panel 10 can be turned on, the voltages of the pixel electrodes of the pixels P can be discharged to the data lines. When the discharge signal ALL_H is switched from the second logic-level voltage V2 to the first logic-level voltage V1, the gate driver 20 can output the gate signals GS1 to GSn of the gate-low voltage VGL.

As described above, in the embodiment of the present invention, when the discharge signal ALL_H of the second logic-level voltage V2 is input, the gate signals GS1 to GSn of the gate-high voltage VGH are output to the gate lines G1 to Gn regardless of the gate control signal GCS. As a result, in the embodiment of the present invention, it is possible to discharge the voltages of the pixel electrodes of the pixels P to the data lines when the display device is powered off. Accordingly, in the embodiment of the present invention, since the data voltages do not remain in the pixels P, the display device does not display an afterimage or an abnormal image when the display device is powered off.

Figure 4:
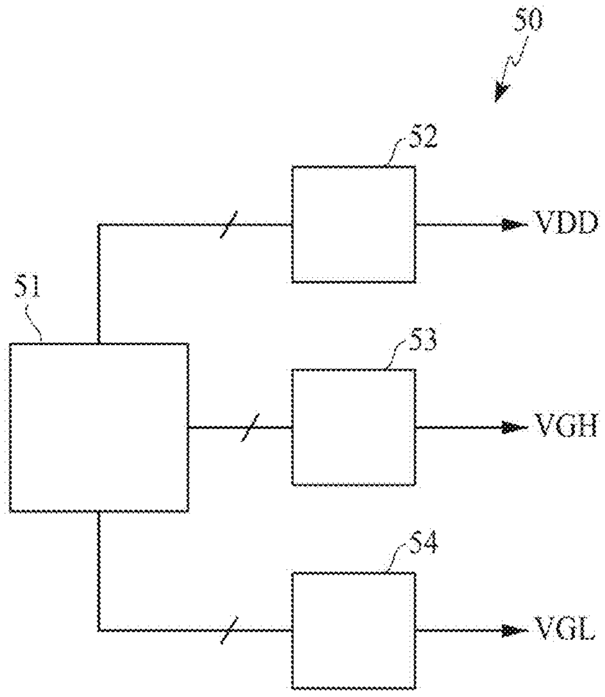
FIG. 4 is a block diagram illustrating a voltage supply unit in FIG. 1 in detail.

FIG. 4 is a block diagram illustrating the voltage supply unit in FIG. 1 in detail. Referring to FIG. 4, the voltage supply unit 50 includes a voltage control circuit 51, a drive voltage supply unit 52, a gate-high voltage supply unit 53, and a gate-low voltage supply unit 54.

The voltage control circuit 51 is coupled to the drive voltage supply unit 52, the gate-high voltage supply unit 53, and the gate-low voltage supply unit 54 and supplies various levels of voltages thereto. The voltage control circuit 51 can be embodied as an IC.

The voltage control circuit 51 receives the power management signal DPM from the timing control unit 40. For example, the voltage control circuit 51 can be turned on when the power management signal DPM of the third logic-level voltage is input, and can be turned off when the power management signal DPM of the fourth logic-level voltage is input. In this case, when the power management signal DPM of the third logic-level voltage is input, the voltage control circuit 51 can be turned on and can supply various levels of voltages to the drive voltage supply unit 52, the gate-high voltage supply unit 53, and the gate-low voltage supply unit 54.

The drive voltage supply unit 52 generates the drive voltage VDD using the voltages input from the voltage control circuit 51. The drive voltage VDD may be a voltage for driving the data driver 30. The drive voltage supply unit 52 supplies the drive voltage VDD to the data driver 30.

The gate-high voltage supply unit 53 generates the gate-high voltage VGH using the voltages input from the voltage control circuit 51. Alternatively, the gate-high voltage supply unit 53 may generate the gate-high voltage VGH using the voltages input from the voltage control circuit 51 and the drive voltage VDD input from the drive voltage supply unit 52. The gate-high voltage supply unit 53 outputs the gate-high voltage VGH to the gate driver 20. Detailed description of the gate-high voltage supply unit 53 will be made later with reference to FIG. 5.

The gate-low voltage supply unit 54 generates the gate-low voltage VGL using the voltages input from the voltage control circuit 51. The gate-low voltage supply unit 54 outputs the gate-low voltage VGL to the gate driver 20.

Figure 5:
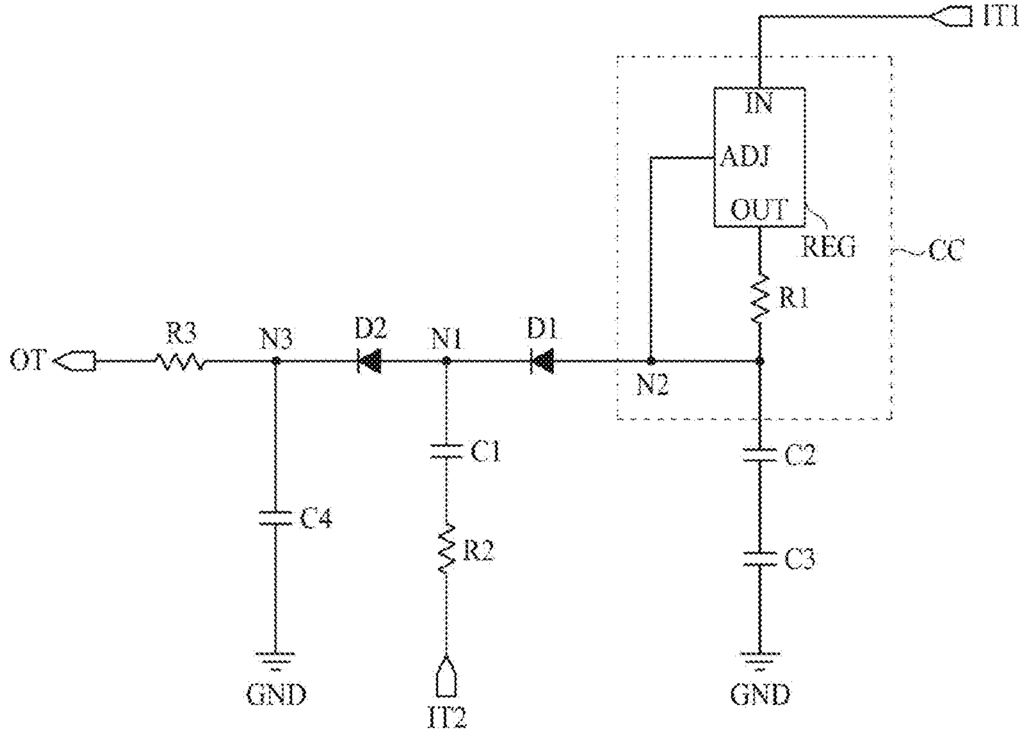
FIG. 5 is a circuit diagram illustrating a gate-high voltage supply unit in FIG. 4 in detail.

FIG. 5 is a circuit diagram illustrating the gate-high voltage supply unit in FIG. 4 in detail. Referring to FIG. 5, the gate-high voltage supply unit 53 includes a first voltage input terminal IT1, a second voltage input terminal IT2, an output terminal OT, a current control circuit CC, and first and second diodes D1 and D2.

A first voltage as a DC voltage is input to the first voltage input terminal IT1. The first voltage may be the voltage input from the voltage control circuit 51 or the drive voltage VDD input from the drive voltage supply unit 52.

The current control circuit CC can be disposed between the first voltage input terminal IT1 and a first node N1. As illustrated in FIG. 5, when the first diode D1 is disposed between the first node N1 and a second node N2, it is preferable that the current control circuit CC is disposed between the first voltage input terminal IT1 and the second node N2. The current control circuit CC includes a regulator REG and a first resistor R1. The regulator REG can be embodied as an IC. An input terminal IN of the regulator REG is coupled to the first voltage input terminal IT1, and an output terminal OUT and an ADJ terminal ADJ thereof are coupled to the second node N2. The first resistor R1 is disposed between the output terminal OUT of the regulator REG and the second node N2.

In this case, the current control circuit CC can control the current value flowing from the first voltage input terminal IT1 to the first node N1 so as to be equal to or lower than a current limit value CLV as expressed by Expression 1.

$$CLV = \frac{Vadj}{RV1} \qquad \text{[Expression 1]}$$

In Expression 1, "CLV" represents the current limit value, "RV1" represents the resistance value of the first resistor R1, "Vadj" represents an output voltage value of the ADJ terminal ADJ of the regulator REG. For example, when the output voltage value Vadj of the ADJ terminal ADJ of the regulator REG is "1.25 V" and the resistance value RV1 of the first resistor R1 is"24.9Ω," the current limit value CLV can be calculated to be approximately 50 mA. In this case, the current control circuit CC can control the current value flowing from the first voltage input terminal IT1 to the first node N1 so as to be equal to or lower than "50 mA."

Figure 6A:
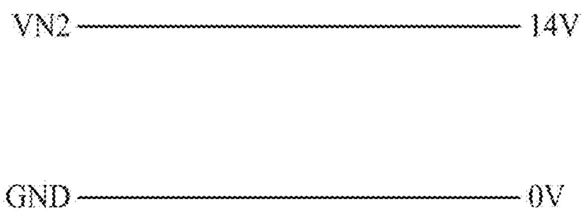
FIGS. 6A to 6D are waveform diagrams illustrating a voltage of a first node, a second voltage, a voltage of a second node, and a voltage of a third node.

The first diode D1 may be disposed between the first node N1 and the current control circuit CC. The first diode D1 supplies the voltage of the second node N2 output from the current control circuit CC to the first node N1 as a DC voltage. For example, the voltage VNs of the second node N2 may be a DC voltage of 14 V as illustrated in FIG. 6A.

Figure 6B:
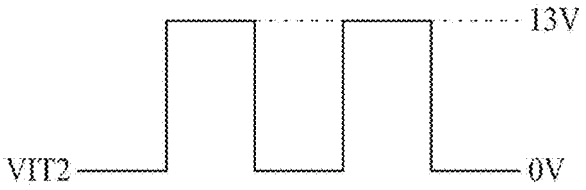

A second voltage as an AC voltage is input to the second voltage input terminal IT2. The second voltage may be a voltage input from the voltage control circuit 51. For example, the second voltage VIT2 may be an AC voltage which can swing between 0 V and 13 V as illustrated in FIG. 6B. A first capacitor C1 and a second resistor R2 may be disposed between the second voltage input terminal IT2 and the first node N1. The second resistor R2 can serve as a damping resistor for protecting the second voltage input terminal IT2.

Figure 6C:
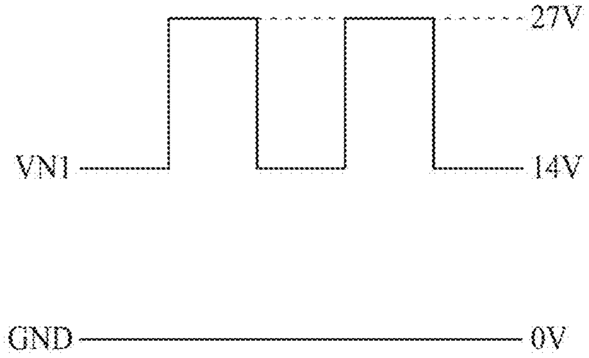

On the other hand, the second voltage which is an AC voltage input to the second voltage input terminal IT2 can be charge-pumped to the DC voltage supplied to the first node N1 via the first diode D1 by the first capacitor C1. For example, when the voltage VN2 of the second node N2 is a DC voltage of 14 V as illustrated in FIG. 6A and the second voltage VIT2 is an AC voltage swinging between 0V and 13 V as illustrated in FIG. 6B, the voltage VN1 of the first node N1 charge-pumped by the first capacitor C1 may be an AC voltage swinging between 14 V and 27 V as illustrated in FIG. 6C.

Figure 6D:
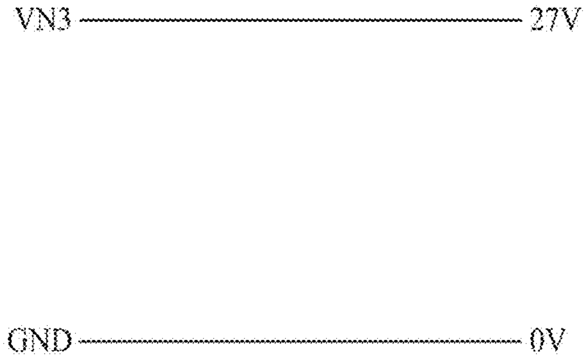

The second diode D2 may be disposed between the first node N1 and the third node N3. The second diode D2 supplies the voltage VN1 of the first node N1 to a third node N3 as a DC voltage. The DC voltage of the third node N3 can be output as the gate-high voltage VGH to the output terminal OUT. For example, when the voltage VN1 of the first node N1 is an AC voltage swinging between 14 V and 27 V as illustrated in FIG. 6C, the voltage VN3 of the third node N3 supplied via the second diode D2 may be a DC voltage of 27 V as illustrated in FIG. 6D. In this case, the DC voltage of 27 V can be output as the gate-high voltage VGH to the output terminal OUT.

Second and third capacitors C2 and C3 coupled in series may be disposed between the second node N2 and a ground voltage source GND. The second and third capacitors C2 and C3 can absorb the surge voltage of the second node N2. A fourth capacitor C4 may be disposed between the third node N3 and the ground voltage source GND, and a third resistor R3 may be disposed between the third node N3 and the output terminal OUT. The fourth capacitor C4 can serve as a smoothing capacitor removing ripples of the DC voltage output from the second diode D2 and the third resistor R3 can prevent an overcurrent from flowing.

On the other hand, it should be noted that the second to fourth capacitors C2, C3, and C4 and the second and third resistors R2 and R3 can be obviated or replaced with other elements by those skilled in the art.

As described above, the gate-high voltage supply unit 53 according to the embodiment of the present invention can control the current value flowing from the first voltage input terminal IT1 to the first node N1 so as to be equal to or lower than the current limit value CLV. As a result, in the embodiment of the present invention, when the display device is not powered off but the gate driver 20 performs an abnormal driving operation of supplying the gate signals of the gate-high voltage VGH to all the gate lines, it is possible to prevent a current supplied from the gate-high voltage supply unit 53 to the gate driver 20 from increasing. The abnormal driving operation of the gate driver 20 can occur when the display device is not powered off and the voltage supply unit 50 normally supplies the drive voltages to the gate driver 20 but the discharge signal ALL_H is input as the second logic-level voltage to the gate driver 20. Accordingly, in the embodiment of the present invention, when the discharge signal ALL_H is normally recovered to the first logic-level voltage, the current supplied from the gate-high voltage supply unit 53 to the gate driver 20 can be recovered to the original state and thus the display device can display a normal image. Detailed description thereof will be made later with reference to FIGS. 7A and 7B and FIGS. 8A and 8B.

Figure 7A:
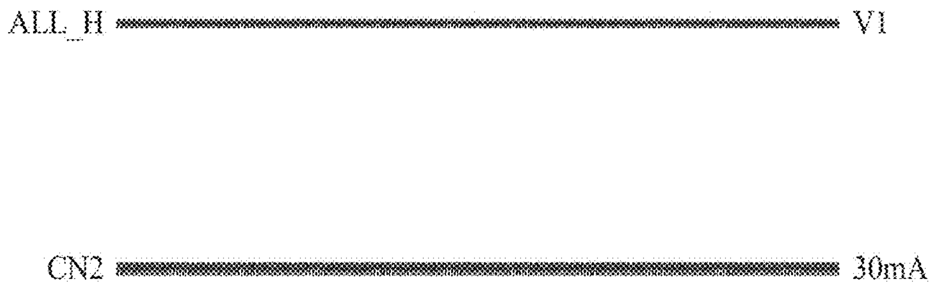
FIGS. 7A and 7B are test diagrams illustrating a current value of the second node of the gate-high voltage supply unit according to the embodiment of the present invention.
Figure 7B:
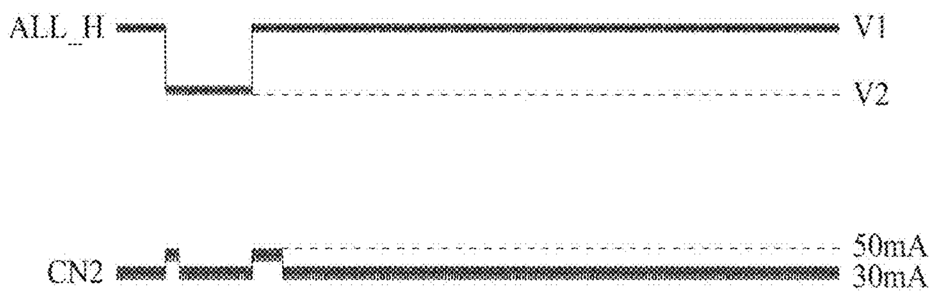

FIGS. 7A and 7B are test diagrams illustrating the current value of the second node of the gate-high voltage supply unit according to the embodiment of the present invention. FIG. 7A illustrates the current value CN2 of the second node N2 of the gate-high voltage supply unit 53 when the discharge signal ALL_H of the first logic-level voltage V1 is input to the gate driver 20. FIG. 7B illustrates the current value CN2 of the second node N2 of the gate-high voltage supply unit 53 when the discharge signal ALL_H of the second logic-level voltage V2 is input to the gate driver 20. In FIG. 7B, the current limit value CLV of the current control circuit CC is 50 mA as described with reference to Expression 1.

Referring to FIG. 7A, when the discharge signal ALL_H of the first logic-level voltage V1 is input to the gate driver 20, the current value CN2 of the second node N2 is maintained at about 30 mA. Referring to FIG. 7B, even when the gate driver 20 requests the gate-high voltage supply unit 53 for a larger current in the period in which the discharge signal ALL_H of the second logic-level voltage V2 is input to the gate driver 20, the current value CN2 of the second node N2 is not larger than 50 mA which is the current limit value CLV.

As described above, in the embodiment of the present invention, the current value flowing from the first voltage input terminal IT1 to the first node N1 can be controlled to be equal to or lower than the current limit value CLV using the current control circuit CC.

Figure 8A:
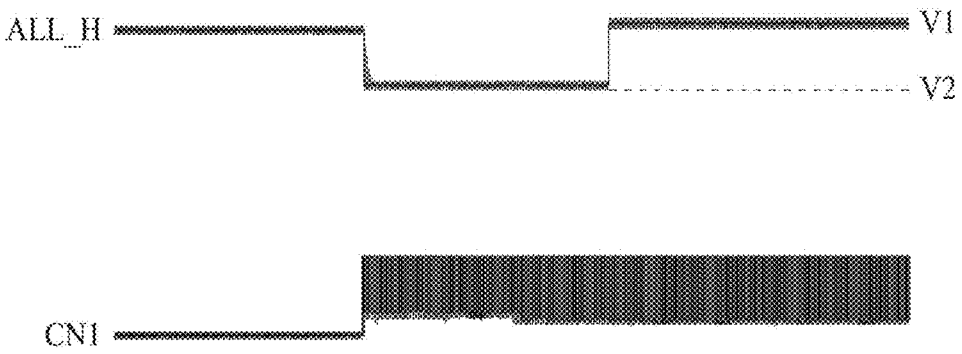
FIGS. 8A and 8B are test diagrams illustrating a current of the first node depending on whether a current control circuit is present.
Figure 8B:
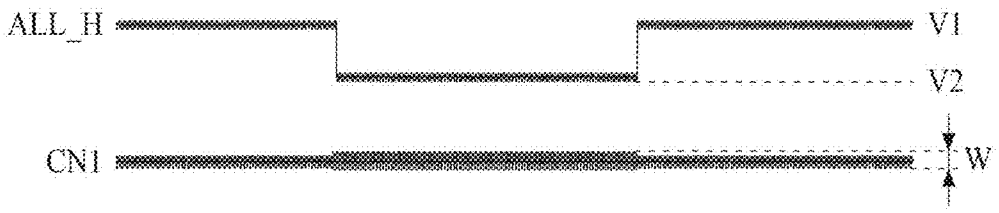

FIGS. 8A and 8B are test diagrams illustrating the current of the first node depending on whether the current control circuit is present. FIG. 8A illustrates the current value CN1 of the first node N1 of the gate-high voltage supply unit 53 not including the current control circuit CC when the discharge signal ALL_H of the second logic-level voltage V2 is input to the gate driver 20. FIG. 8B illustrates the current value CN1 of the first node N1 of the gate-high voltage supply unit 53 including the current control circuit CC when the discharge signal ALL_H of the second logic-level voltage V2 is input to the gate driver 20.

Referring to FIG. 8A, when the gate-high voltage supply unit 53 does not include the current control circuit CC and the discharge signal ALL_H of the second logic-level voltage V2 is input to the gate driver 20, the current value CN1 of the first node N1 rapidly increases.

Referring to FIG. 8B, when the gate-high voltage supply unit 53 includes the current control circuit CC and the discharge signal ALL_H of the second logic-level voltage V2 is input to the gate driver 20, the current value CN1 of the first node N1 does not rapidly increase. That is, when the gate-high voltage supply unit 53 includes the current control circuit CC, the current value CN1 of the first node N1 increases by a width W smaller than that when the gate-high voltage supply unit 53 does not include the current control circuit CC.

When the gate-high voltage supply unit 53 includes the current control circuit CC and the discharge signal ALL_H is switched from the first logic-level voltage V1 to the second logic-level voltage V2, the current value CN1 of the first node increases by a predetermined width W. Thereafter, when the discharge signal ALL_H is switched from the second logic-level voltage V2 to the first logic-level voltage V1, the current value CN1 of the first node decreases by the predetermined width W. That is, when the discharge signal ALL_H is normally recovered to the first logic-level voltage, the current value CN1 of the first node can be recovered to the original state.

Preferably, the predetermined width W is set to such an extent to recover the current value CN1 of the first node N1 when the discharge signal ALL_H is recovered from the second logic-level voltage V2 to the first logic-level voltage V1. The predetermined width W can be proportional to the current limit value CLV to a certain extent. For example, when the gate-high voltage supply unit 53 includes the current control circuit CC, the predetermined width W can become larger as the current limit value CLV becomes larger and can become smaller as the current limit value CLV becomes smaller.

As described above, when the display device is not powered off and the gate-high voltage supply unit 53 normally supplies the drive voltages to the gate driver 20 but the discharge signal ALL_H of the second logic-level voltage V2 is input to the gate driver 20, the gate driver 20 performs an abnormal driving operation of supplying the gate signals of the gate-high voltage VGH to all the gate lines. In the abnormal driving operation, the gate driver 20 requires a current much higher than that in the normal driving operation. Accordingly, when the gate-high voltage supply unit 53 does not include the current control circuit CC, the gate-high voltage supply unit 53 supplies the gate driver 20 with a current much higher than that when the gate driver 20 performs the normal driving operation.

However, in the embodiment of the present invention, the current value flowing from the first voltage input terminal IT1 to the first node N1 can be controlled to be equal to or lower than the current limit value CLV using the current control circuit CC as illustrated in FIG. 7B. Accordingly, in the embodiment of the present invention, the current value supplied from the gate-high voltage supply unit 53 to the gate driver 20 can be controlled to be equal to or less than a predetermined value as illustrated in FIG. 8B. At this time, the predetermined value corresponds to the current value with which the current supplied from the gate-high voltage supply unit 53 to the gate driver 20 can be recovered when the discharge signal ALL_H is normally recovered to the first logic-level voltage. As a result, in the embodiment of the present invention, when the discharge signal ALL_H is normally recovered to the first logic-level voltage, the current supplied from the gate-high voltage supply unit 53 to the gate driver 20 can be recovered to the original value and the display device can display a normal image.

In the embodiment of the present invention, since the current value supplied from the gate-high voltage supply unit 53 to the gate driver 20 can be controlled to be equal to or less than a predetermined value as illustrated in FIG. 8B, it is possible to prevent damage of a component such as burning-out of the resistor of the gate-high voltage supply unit 53.

It will be apparent to those skilled in the art that various modifications and variations can be made in the voltage supply unit and display device having the same of the present invention without departing from the spirit or scope of the invention. Thus, it is intended that the present invention cover the modifications and variations of this invention provided they come within the scope of the appended claims and their equivalents.

What is claimed is:

1. A display device, comprising:

a display panel that includes data lines, gate lines, and pixels coupled to the data lines and the gate lines;

a gate driver supplying gate signals to the gate lines;

a discharge control circuit supplying a discharge signal to the gate driver, the discharge signal having a first logic-level voltage in a normal mode when images are displayed and having a second logic-level voltage in a discharge mode when images are not displayed;

a timing control unit supplying a gate control signal for controlling an operation timing of the gate driving timing to the gate driver; and a gate-high voltage supply unit supplying gate-high voltages to the gate driver, wherein the gate-high voltage supply unit includes:

a first voltage input terminal to which a first voltage as a DC voltage is input, a second voltage input terminal to which a second voltage as an AC voltage is input, a first capacitor and a damping resistor between a first node and the second voltage input terminal, and a current control circuit between the first voltage input terminal and the first node and controlling a current value flowing from the first voltage input terminal to the first node so as to be equal to or less than a current limit value, and wherein a current value of the first node has an increased amplitude width when the discharge signal is switched from the first logic-level voltage to the second logic-level voltage, and then the current value of the first node has a decreased amplitude width when the discharge signal is switched from the second logic-level voltage to the first logic-level voltage.

2. The display device according to claim 1, wherein the current control circuit includes:

a regulator of which an input terminal is coupled to the first voltage input terminal and of which an output terminal and an ADJ terminal are coupled to the first node; and a first resistor between the output terminal of the regulator and the first node.

3. The display device according to claim 2, wherein when the current limit value is defined as CLV, a resistance value of the first resistor is defined as RV1, and an output voltage of the ADJ terminal of the regulator is defined as Vadj, the current limit value is defined by:

$$CLV = \frac{Vadj}{RV1}.$$

4. The display device according to claim 2, wherein the gate-high voltage supply unit further includes:

a first diode between the first node and the current control circuit; and a second diode between the first node and an output terminal.

5. The display device according to claim 1, wherein the gate driver generates gate signals having pulses of the gate-high voltage and outputs the generated gate signals to the gate lines in response to the gate control signal when the discharge signal of the first logic-level voltage is input, and outputs the gate signals of the gate-high voltage to the gate lines when the discharge signal of the second logic-level voltage is input.

6. A display device, comprising:

a display panel that includes data lines, gate lines, and pixels coupled to the data lines and the gate lines;

a gate driver supplying gate signals to the gate lines;

a discharge control circuit supplying a discharge signal to the gate driver, the discharge signal having a first logic-level voltage in a normal mode when images are displayed and having a second logic-level voltage in a discharge mode when images are not displayed; and a gate-high voltage supply unit supplying gate-high voltages to the gate driver, wherein the gate driver performs an abnormal driving operation of supplying a gate-high voltage to the gate lines in a state in which the display device is not powered off, a current value of a voltage input to the gate-high voltage supply unit is controlled to be equal to or less than a current limit value so as to prevent a current supplied from the gate-high voltage supply unit to the gate driver from increasing, wherein the current value has an increased amplitude width when the gate-high voltage supply unit is operated in the discharge mode, and the current value has a decreased amplitude width when gate-high voltage supply unit is operated in the normal mode, and wherein the current value has an increased amplitude width when the discharge signal is switched from the first logic-level voltage to the second logic-level voltage, and then the current value has a decreased amplitude width when the discharge signal is switched from the second logic-level voltage to the first logic-level voltage.

* * * * *